(12) United States Patent
Ostermaier et al.

(10) Patent No.: US 9,076,763 B2
(45) Date of Patent: Jul. 7, 2015

(54) HIGH BREAKDOWN VOLTAGE III-NITRIDE DEVICE

(75) Inventors: Clemens Ostermaier, Villach (AT); Gerhard Prechtl, Rosental (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 314 days.

(21) Appl. No.: 13/584,442

(22) Filed: Aug. 13, 2012

(65) Prior Publication Data

US 2014/0042448 A1 Feb. 13, 2014

(51) Int. Cl.
| H01L 21/762 | (2006.01) |
| H01L 29/778 | (2006.01) |
| H01L 29/66 | (2006.01) |
| H01L 29/417 | (2006.01) |
| H01L 29/06 | (2006.01) |
| H01L 29/20 | (2006.01) |

(52) U.S. Cl.
CPC ...... *H01L 29/41766* (2013.01); *H01L 29/0653* (2013.01); *H01L 29/66462* (2013.01); *H01L 29/7787* (2013.01); *H01L 29/0649* (2013.01); *H01L 29/2003* (2013.01)

(58) Field of Classification Search
CPC ............ H01L 29/2003; H01L 29/7787; H01L 29/0642; H01L 29/0649; H01L 29/0653; H01L 29/66462; H01L 29/41766
USPC .................. 257/192, 194, 200–201, E29.246, 257/E21.403
See application file for complete search history.

(56) References Cited

U.S. PATENT DOCUMENTS

| 5,413,947 | A | * | 5/1995 | Kim et al. ..................... 438/184 |
| 6,075,259 | A | * | 6/2000 | Baliga ............................. 257/77 |
| 8,546,207 | B2 | | 10/2013 | Kittler et al. |
| 8,614,447 | B2 | * | 12/2013 | Hekmatshoartabari et al. .............................. 257/76 |
| 2003/0071317 | A1 | * | 4/2003 | Ohyanagi et al. ............. 257/409 |
| 2005/0258451 | A1 | * | 11/2005 | Saxler et al. .................. 257/192 |

(Continued)

FOREIGN PATENT DOCUMENTS

DE 102009051521 A1 5/2011

OTHER PUBLICATIONS

Nariaki Ikeda, et al. "High power AlGaN/GaN HFET with a high breakdown voltage of over 1.8 kV on 4 inch Si substrates and the suppression of current collapse." Proceedings of the 20th International Symposium on Power Semiconductor Devices & IC's, 2008. Orlando, FL. IEEE. pp. 287-290.

(Continued)

*Primary Examiner* — Marvin Payen
*Assistant Examiner* — Jeremy Joy
(74) *Attorney, Agent, or Firm* — Murphy, Bilak & Homiller, PLLC

(57) ABSTRACT

A semiconductor device includes a semiconductor body having a compound semiconductor material on a substrate. The compound semiconductor material has a channel region. A source region extends to the compound semiconductor material. A drain region also extends to the compound semiconductor material and is spaced apart from the source region by the channel region. An insulating region is buried in the semiconductor body between the compound semiconductor material and the substrate in an active region of the semiconductor device. The active region includes the source, the drain and the channel region of the device. The insulating region is discontinuous over a length of the channel region between the source region and the drain region.

13 Claims, 11 Drawing Sheets

(56) References Cited

U.S. PATENT DOCUMENTS

| | | | |
|---|---|---|---|
| 2006/0060895 A1* | 3/2006 | Hikita et al. | 257/280 |
| 2007/0105335 A1* | 5/2007 | Fitzgerald | 438/405 |
| 2007/0210335 A1* | 9/2007 | Ikeda et al. | 257/201 |
| 2008/0290371 A1* | 11/2008 | Sheppard et al. | 257/192 |
| 2009/0267078 A1* | 10/2009 | Mishra et al. | 257/76 |
| 2010/0264462 A1* | 10/2010 | Hirler et al. | 257/194 |
| 2012/0098035 A1* | 4/2012 | Bahl et al. | 257/194 |
| 2012/0153390 A1* | 6/2012 | Mishra et al. | 257/339 |
| 2012/0223367 A1 | 9/2012 | Kittler et al. | |

OTHER PUBLICATIONS

Bin Lu, et al. "High Breakdown (> 1500 V) AlGaN/GaN HEMTs by Substrate-Transfer Technology." IEEE Electron Device Letters, vol. 31, No. 9. IEEE. Sep. 2010. pp. 951-953.

Puneet Srivastava, et al. "Record Breakdown Voltage (2200 V) of GaN DHFETs on Si With 2-μm Buffer Thickness by Local Substrate Removal." IEEE Electron Device Letters, vol. 32, No. 1. IEEE. Jan. 2011. pp. 30-32.

* cited by examiner

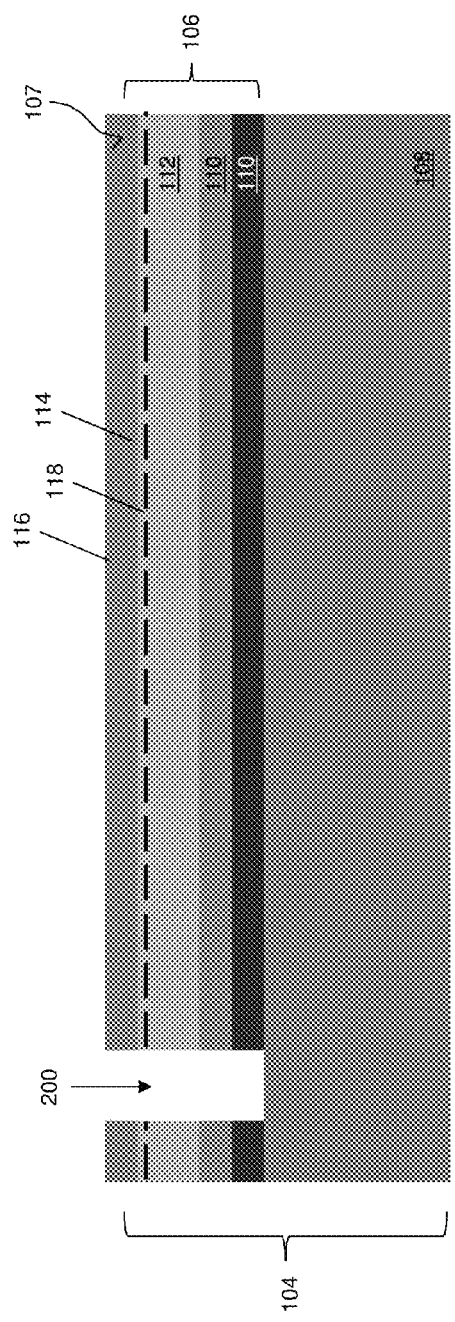
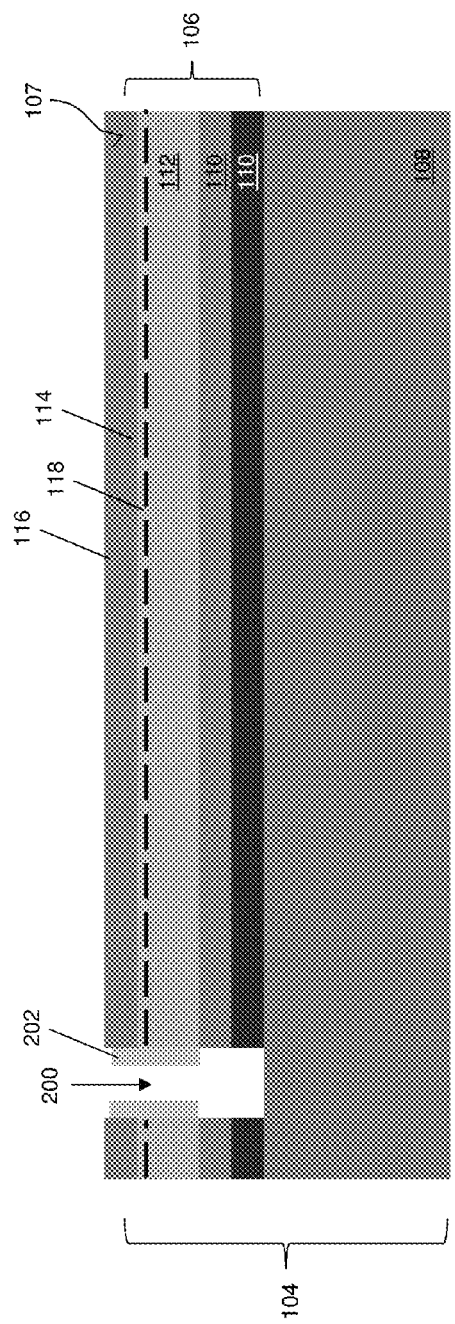
Figure 8A
Figure 8B

HIGH BREAKDOWN VOLTAGE III-NITRIDE DEVICE

TECHNICAL FIELD

The instant application relates to III-nitride devices, and more particularly to high breakdown voltage III-nitride devices.

BACKGROUND

High electron mobility transistors (HEMTs) based on gallium nitride (GaN) are well-suited as high breakdown voltage devices due to a high energy band gap of 3.4 eV for GaN. This means that smaller device lengths can withstand comparably larger blocking voltages, resulting in lower on-resistance and capacitance. Due to the epitaxial processing widely used to fabricate multi-layer HEMT structures, most conventional HEMTs are lateral source-drain devices with an optional plug connection which extends through the III-nitride epitaxial stack in order to realize a quasi-vertical device. The thickness of the III-nitride epitaxial stack of such a structure must withstand the same blocking voltage as the lateral blocking voltage of the source-drain extension.

The voltage class of a conventional HEMT device can be adjusted by varying the epitaxial thickness. Such methods require long and expensive deposition of GaN layers, which causes significant wafer bow during high temperatures processing. Therefore, only a limited temperature budget can be applied in any post-epitaxial processing, potentially eliminating the possibility for n+ source/drain region implantation/activation.

The substrate underneath the lateral GaN HEMT can be removed to increase the breakdown voltage robustness of the device. However, removal of the substrate is rather difficult to achieve for large power devices due to a final device thickness of only a few micrometers. In addition, a generally flat device backside is preferred in order to provide a good thermal connection to the lead frame which prevents the use of deep trenches below the drift region.

SUMMARY

According to the embodiments described herein, the epitaxial thickness of an III-nitride device is reduced without adversely affecting the breakdown voltage of the device by replacing part of the epi and/or underlying substrate with an insulating region.

According to an embodiment of a semiconductor device, the semiconductor device comprises a semiconductor body including a compound semiconductor material on a substrate. The compound semiconductor material has a channel region. A source region extends to the compound semiconductor material. A drain region also extends to the compound semiconductor material and is spaced apart from the source region by the channel region. An insulating region is buried in the semiconductor body between the compound semiconductor material and the substrate in an active region of the semiconductor device. The active region includes the source, the drain and the channel region of the device. The insulating region is discontinuous over a length of the channel region between the source region and the drain region.

According to another embodiment of a semiconductor device, the semiconductor device comprises a semiconductor substrate and a compound semiconductor epitaxial material grown on the semiconductor substrate. The compound semiconductor epitaxial material has a channel region and a higher energy band gap than the semiconductor substrate. A first doped region extends to the compound semiconductor epitaxial material. A second doped region also extends to the compound semiconductor epitaxial material and is spaced apart from the first doped region by the channel region. An insulating region is disposed below the channel region between the compound semiconductor epitaxial material and the substrate, and extends laterally in a direction parallel to a main surface of the semiconductor substrate. The insulating region is discontinuous over a length of the channel region between the first and second doped regions.

According to an embodiment of a method of producing a semiconductor device, the method comprises: forming a semiconductor body including a compound semiconductor material on a substrate, the compound semiconductor material having a channel region; forming a source region extending to the compound semiconductor material; forming a drain region extending to the compound semiconductor material and spaced apart from the source region by the channel region; and forming an insulating region buried in the semiconductor body between the compound semiconductor material and the substrate in an active region of the semiconductor device, the active region including the source, the drain and the channel region. The insulating region is discontinuous over a length of the channel region between the source region and the drain region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 8A through 8E illustrate cross-sectional views of a semiconductor body during different phases of a manufacturing process.

DETAILED DESCRIPTION

Described next are embodiments of a compound semiconductor device such as a heterostructure field effect transistor (HFET) having a reduced epitaxial thickness which does not adversely affect the breakdown voltage of the device. The term HFET is also commonly referred to as HEMT (high electron mobility transistor), MODFET (modulation-doped FET) or MESFET (metal semiconductor field effect transistor). The terms compound semiconductor device, HFET, HEMT, MESFET and MODFET are used interchangeably herein to refer to a device incorporating a junction between two materials with different band gaps (i.e. a heterojunction) as the channel. For example, GaAs may be combined with AlGaAs, GaN may be combined with AlGaN, InGaAs may be combined with InAlAs, GaN may be combined with InGaN, etc. Also, transistors may have AlInN/AlN/GaN barrier/spacer/buffer layer structures. The term compound semiconductor device as used herein may also refer to a transistor fabricated using a single epitaxial compound semiconductor epitaxial such as epitaxial SiC.

In each case, the epitaxial thickness of the compound semiconductor device is reduced without adversely affecting the breakdown voltage of the device by replacing part of the epitaxial (epi for short) and/or underlying substrate with an insulating region. Doing so reduces the overall cost of the device, and reduces the complexity of high temperature processes due to wafer bowing which can be caused by a thick epi. For quasi-vertical device structures, a highly conductive substrate can be used which would typically require a comparably thicker epi layer in order to withstand the same blocking voltage as in a lateral design. The techniques described here also minimize parasitic capacitances due to the use of a low k-material (with respect to the dielectric constant of the epi) such as silicon oxide, silicon nitride, diamond, etc.

Figure 1:
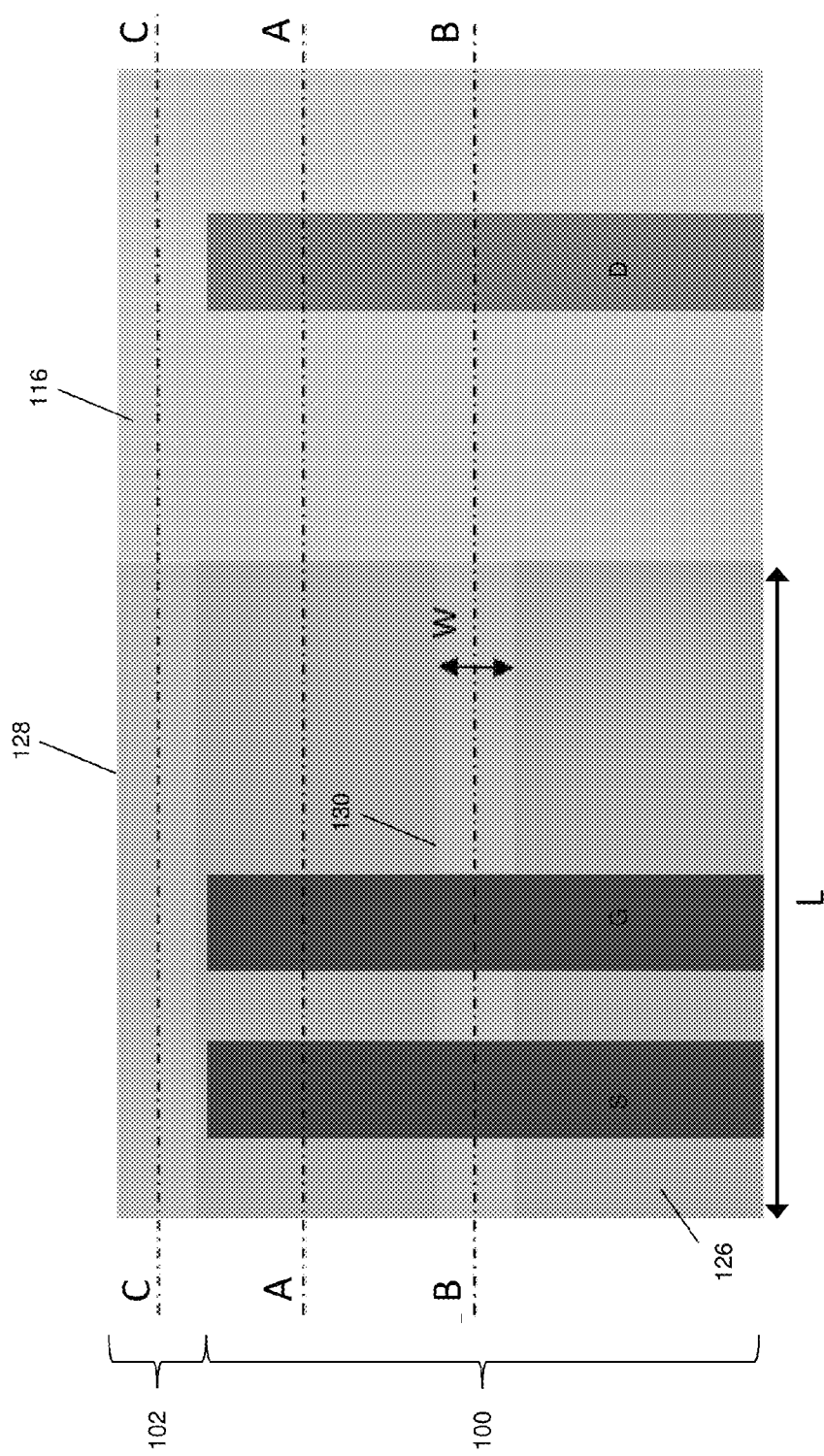
FIG. 1 illustrates a top-down view of a high breakdown voltage compound semiconductor device with different layers removed in different parts of the device.
Figure 2:
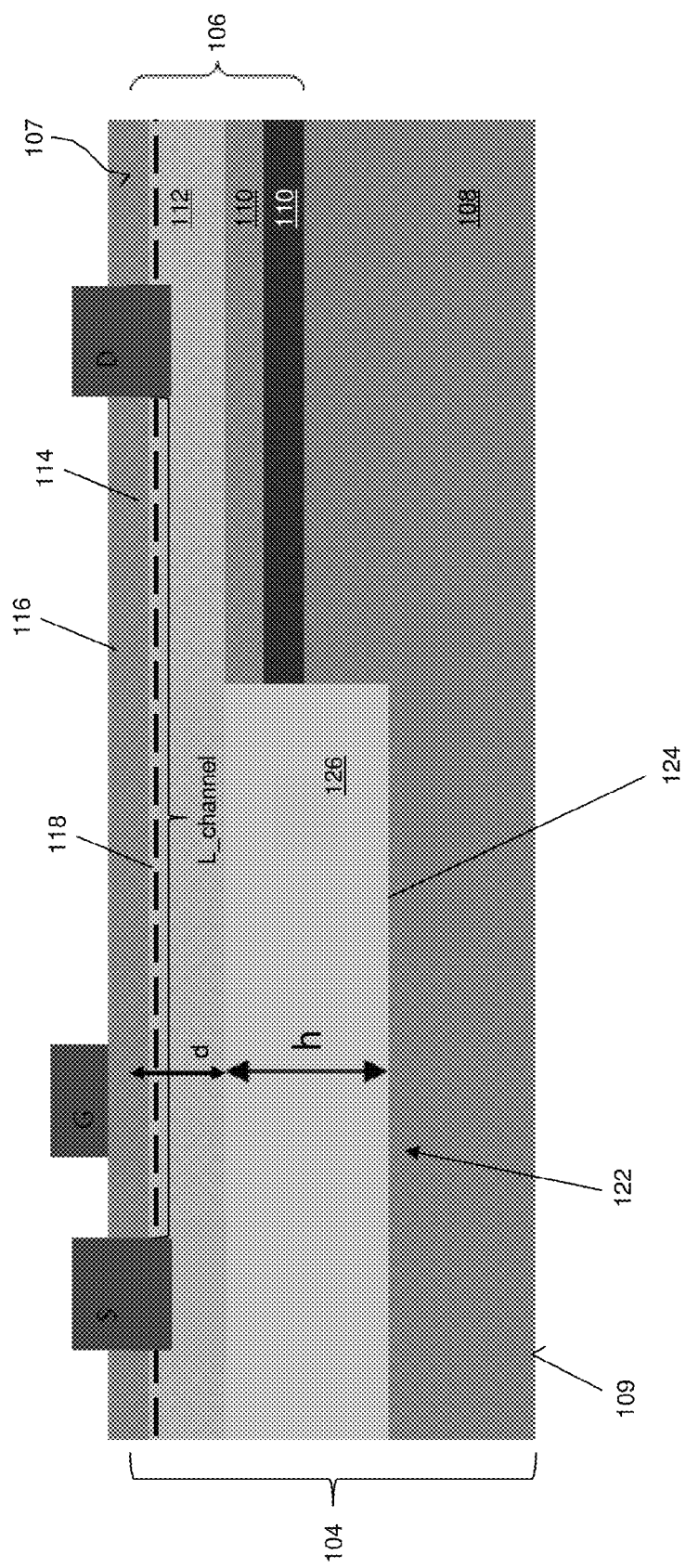
FIGS. 2 and 3 illustrate cross-sectional views of the compound semiconductor device along the line labeled 'A-A' according to different embodiments.
Figure 3:
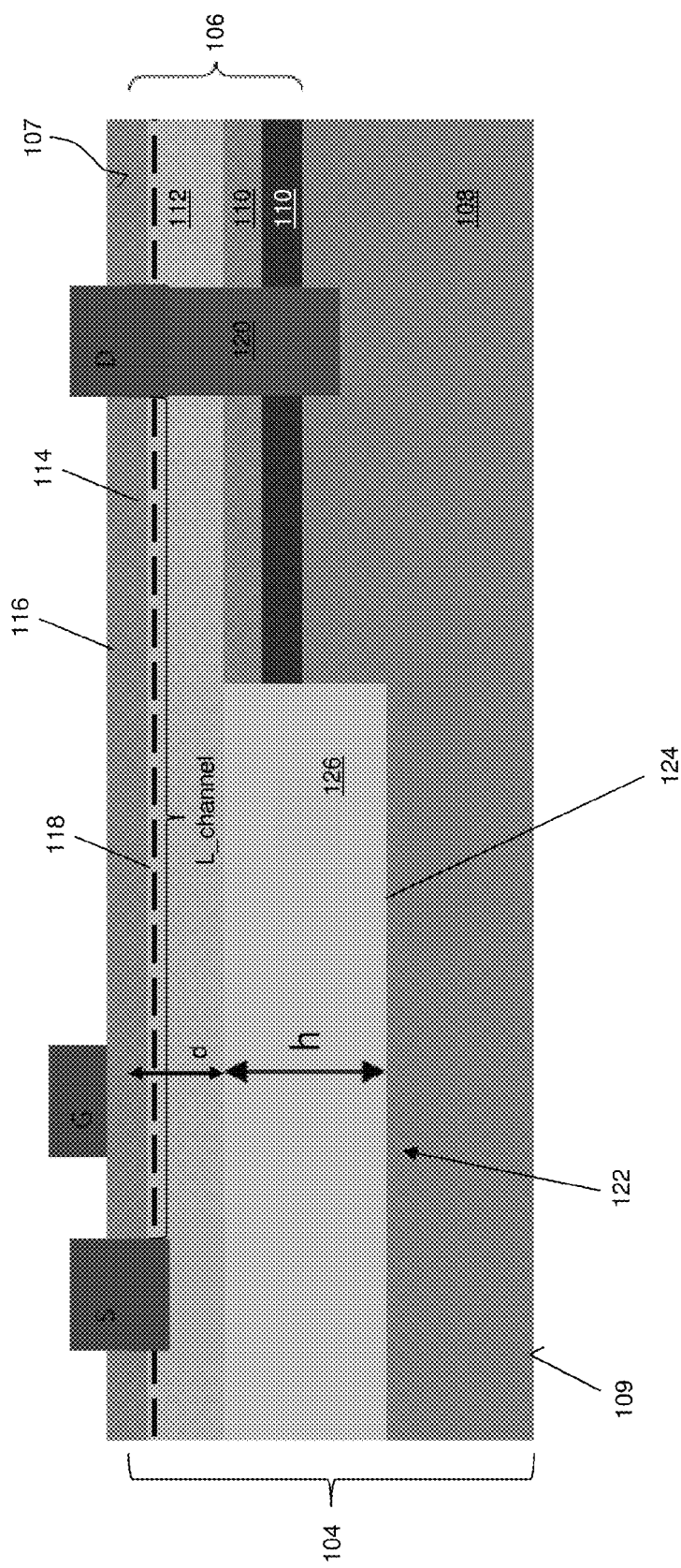
Figure 4:
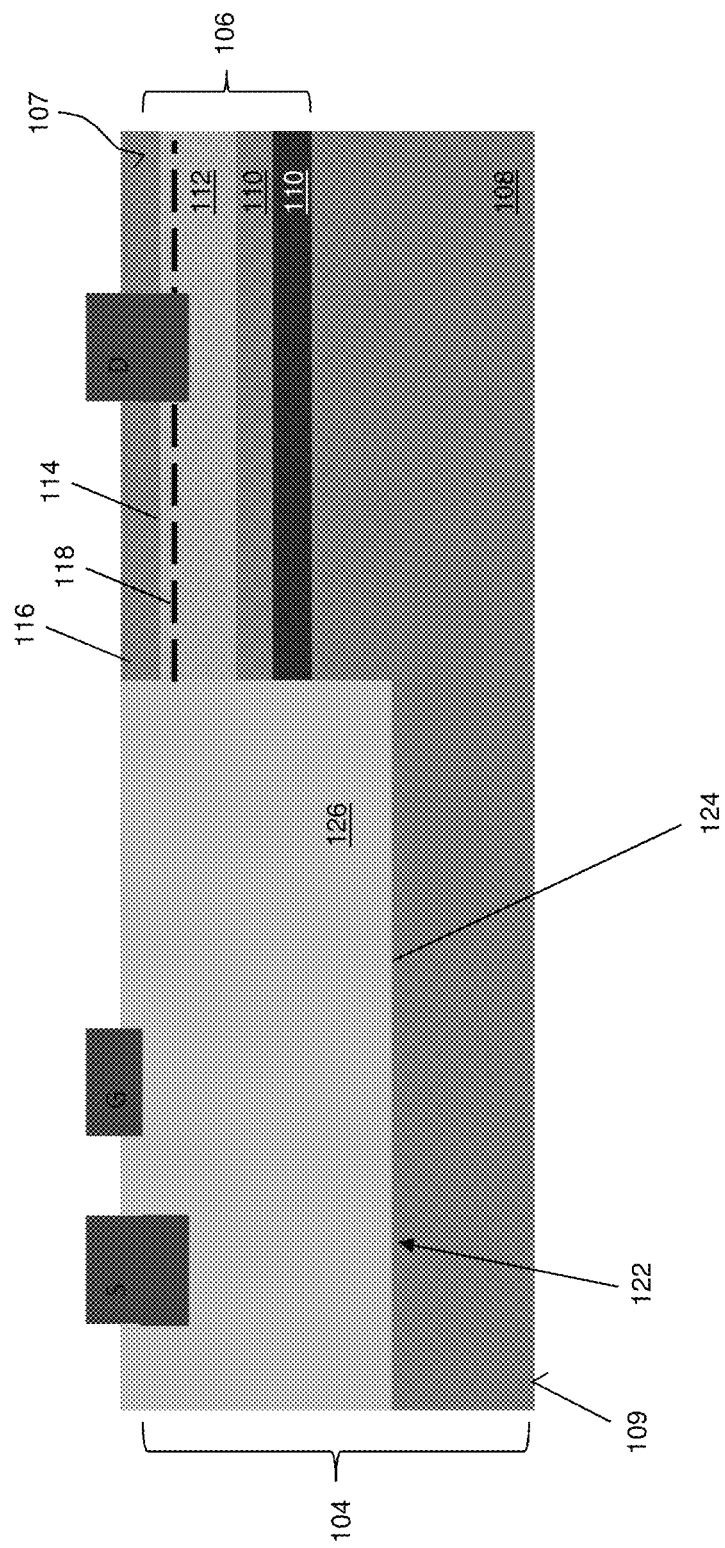
FIG. 4 illustrates a cross-sectional view of the compound semiconductor device along the line labeled 'B-B' according to an embodiment.
Figure 5:
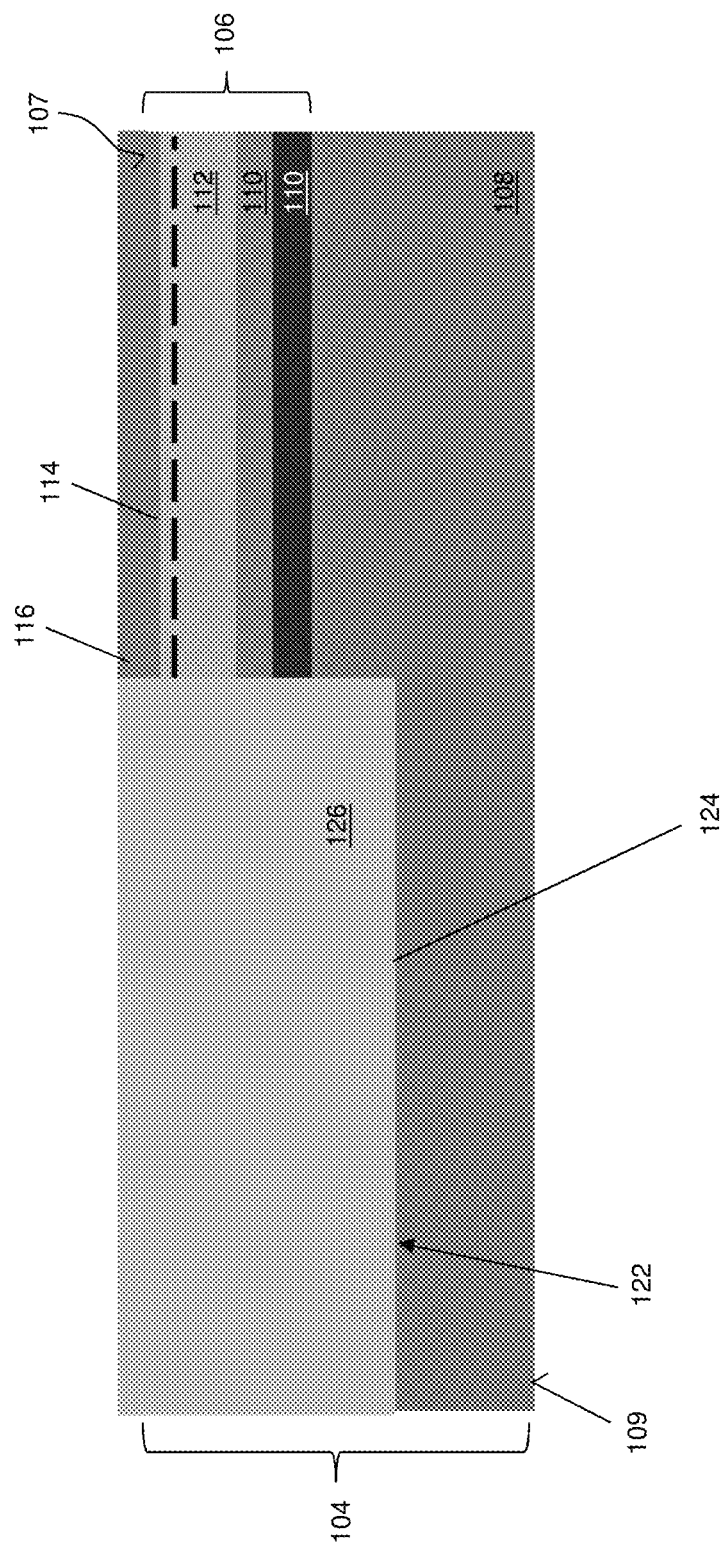
FIG. 5 illustrates a cross-sectional view of the compound semiconductor device along the line labeled 'C-C' according to an embodiment.

FIG. 1 illustrates a top-down view of a compound semiconductor device with different layers removed in different parts of the device. FIGS. 2 and 3 illustrate cross-sectional views of alternative embodiments of the semiconductor device along the line labeled 'A-A' in FIG. 1 in an active region 100 of the device. FIG. 4 illustrates a cross-sectional view of the semiconductor device along the line labeled 'B-B' in FIG. 1 in the active region 100 of the device. FIG. 5 illustrates a cross-sectional view of the semiconductor device along the line labeled 'C-C' in FIG. 1 in an inactive region 102 of the device e.g. the device edge or between so-called fingers (parallel active regions) of the device.

The semiconductor device includes a semiconductor body 104 comprising a compound semiconductor material 106 such as an epitaxial (epi for short) layer or a stack of epi layers grown on a substrate 108. The compound semiconductor material is shown in FIGS. 2-5 as a stack of III-nitride epitaxial layers e.g. a GaN buffer layer 112 on one or more transition layers 110 and a GaN alloy barrier layer 114 such as AlGaN, InAlN, AlN or InAlGaN on the GaN buffer layer 112. However, the compound semiconductor material 106 can be a single epitaxial layer such as SiC. In each case, the substrate 108 can be a doped or undoped silicon or compound semiconductor wafer and a passivation layer 116 can be provided on the semiconductor body 104. A channel region 118 forms in the compound semiconductor material 106 e.g. in the GaN buffer layer 112 near the interface with the overlying GaN alloy barrier layer 114 for GaN technology.

With GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas such as a 2DEG (two-dimensional electron gas) or 2DHG (two-dimensional hole gas) forms the channel region 118 of the device. A thin, e.g. 1-2 nm, AlN layer can be provided between the GaN buffer layer 112 and the GaN alloy barrier layer 114 to minimize alloy scattering and enhance 2DEG mobility. Other compound semiconductor technologies which have a two-dimensional electron or hole gas can also be used. In each case, polarization charges result in the formation of the channel region 118 of the device. Other combinations of III-V semiconductor materials can be used in order to form a 2DEG or 2DHG channel region 118 in the compound semiconductor material 106, as is well known in the art. In general, any heterostructure can be used where a band discontinuity is responsible for the device concept. For example with an AlGaAs system there is no piezoelectric effect, but a confinement concept which involves arranging quantum wells for confinement of the channel region 118 is possible.

The compound semiconductor device further includes a source region (S) that extends to the compound semiconductor material 106 in contact with the channel region 118 at one end. A drain region (D) extends to the compound semiconductor material 106 in contact with the channel region 118 at the other end, and is spaced apart from the source region by the channel region 118. The source and drain can be formed by doping defined regions of the compound semiconductor material 106. A gate (G) is provided on or in the compound semiconductor material 106 for controlling the channel region 118.

The device can be a lateral device in that the source, drain and gate are contacted at the same side of the semiconductor body 104, e.g. as shown in FIG. 2, and current flows generally in a lateral direction between the source and drain. Alternatively, the device can be a quasi-vertical device in that the source and drain are contacted at opposite sides of the semiconductor body and current flows partly in a lateral direction and partly in a vertical direction between the source and drain. For example, a conductive plug 120 can extend from the drain, through the compound semiconductor material 106 to a side 109 of the substrate 108 facing away from the compound semiconductor material 106 as shown in FIG. 3. Alternatively, the conductive plug 120 can be provided on the source-side. In each case, the device can be normally-on or normally-off as is well known in the art.

Figure 6:
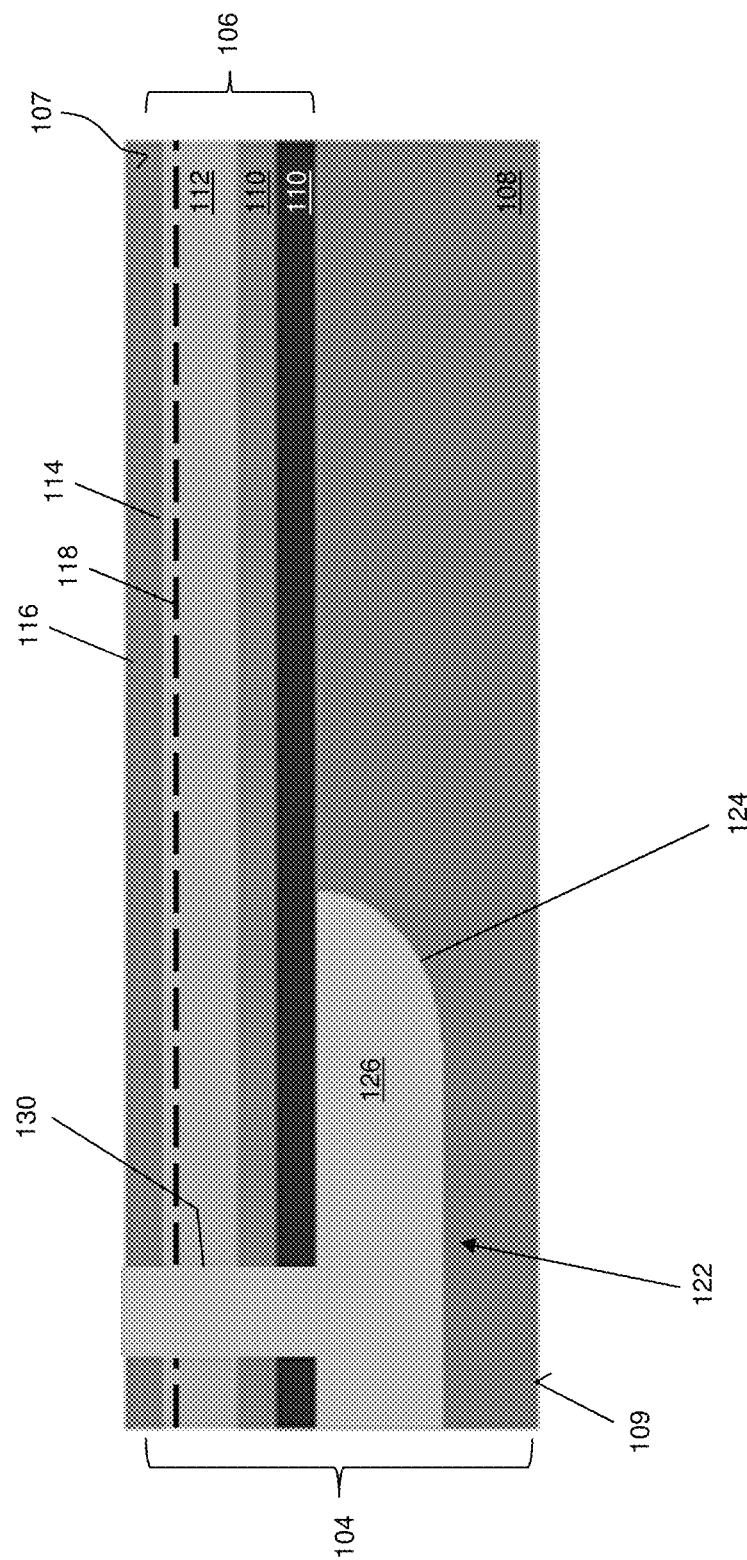
FIG. 6 illustrates a cross-sectional view of another embodiment of a high breakdown voltage compound semiconductor device.

The compound semiconductor device also includes an insulating region 122 buried in the semiconductor body 104 between the compound semiconductor material 106 and the substrate 108 in the active region of the device 100 and/or in the inactive region 102 (the active region including the source, the drain and the channel region 118). For GaN-based technologies, the insulating region 122 is disposed below the GaN alloy barrier layer 114 as shown in FIGS. 2-5. In general, the insulating region 122 is disposed below the channel region 118. The insulating region 122 can be disposed on the source-side of the device or the drain-side, but does not extend continuously from one side to the other side. That is, the insulating region 122 is discontinuous over the length (L_channel) of the channel between the source and the drain. As such, the compound semiconductor material 106 is thinner over the insulating region 122 and thicker elsewhere for embodiments where the insulating region 122 is disposed partly in the compound semiconductor material 106 e.g. as shown in FIG. 2. Otherwise, the compound semiconductor material 106 can have the same thickness over the insulating region 122 and elsewhere if the insulating region 122 is disposed entirely in the underlying substrate 108 e.g. as shown in FIG. 6 which is described in more detail later herein. The insulating region 122 extends laterally in a direction parallel to a main surface 109 of the semiconductor substrate 108.

In each case, the thickness of the compound semiconductor material 106 can be reduced without adversely affecting the breakdown voltage of the device by replacing part of the compound semiconductor material 106 and/or underlying substrate 108 with the insulating region 122. Doing so increases the breakdown voltage capability of the device as compared to conventional devices with the same epi thickness, or provides the same breakdown voltage capability as conventional devices with a thicker epi.

In one embodiment, the insulating region 122 comprises a cavity 124 filled with an insulating material 126 such as silicon oxide, silicon nitride, diamond, or any other suitable insulating material having a dielectric constant lower than that of the surrounding semiconductor material. The cavity 124 has a height (h) which is determined by the etch process employed to form the cavity 124. The insulating material 126 disposed in the cavity 124 can be of a single homogenous construction or include stacks of different materials. The cavity 124 can be formed partly in the compound semiconductor material 106 and partly in the substrate 108 as shown in FIGS. 2-5. Alternatively, the cavity 124 can be formed entirely in the substrate 108 below the compound semiconductor material 106 as shown in FIG. 6.

In each case, a trench 128 can be formed in the inactive region 102 of the device which extends from a main surface 107 of the compound semiconductor material 106 to a depth (d) corresponding to where the top of the cavity 124 is to be subsequently formed. The trench 128 is used to fill the later formed cavity 124 with an insulating material 126 to form the insulating region 122 which is buried in the semiconductor body 104 between the compound semiconductor material 106 and the substrate 108 in the active region 100 of the device as shown in FIGS. 1 and 5. This trench 128 extends perpendicular to the source and the drain over the length (L) of the insulating region 122 so that the cavity 124 can be completely filled with the insulating material 126. An additional trench 130 can also be formed in the active device region 100 as shown in FIGS. 1 and 4. The trenches 128, 130 each have a width (w) sufficient to collectively ensure the cavity 124 is completely filled with the insulating material 126 according to these embodiments. For example, the width (w) of at least the trench 128 in the inactive region 102 can be about the same width as the filling height (h) of the underlying cavity 124. Thus a filling process using a standard LPCVD (low pressure chemical vapor deposition) process with aspect ratios up to 20 can yield reasonable cavity filling without significant area penalty.

For GaN technology, the trench(es) 128, 130 are used to remove parts of the GaN alloy barrier layer 114 and/or the GaN buffer layer 112 selectively by dry and wet etching to below the channel region 118. The resulting cavity 124 can be filled with a low-k dielectric material 126 such as silicon oxide, silicon nitride, diamond etc. deposited by ALD (atomic layer deposition) or LPCVD. The resulting insulating region 122 reduces the blocking distance between the source and drain by material other than the compound semiconductor material 106. The thickness or height (h) of the insulating region 122 can be adjusted to the voltage class of the device. The maximum depth of under etching below the channel region 118 depends on the maximum device voltage in comparison to the blocking capability of the GaN buffer 112 without the insulating region 122. In addition, the depth of the insulating region 122 is limited by the stability of the material remaining below the insulating region 122. The insulating region 122 reduces the source-to-drain and gate-to-drain capacitances of the device and therefore improves device performance.

Figure 7:
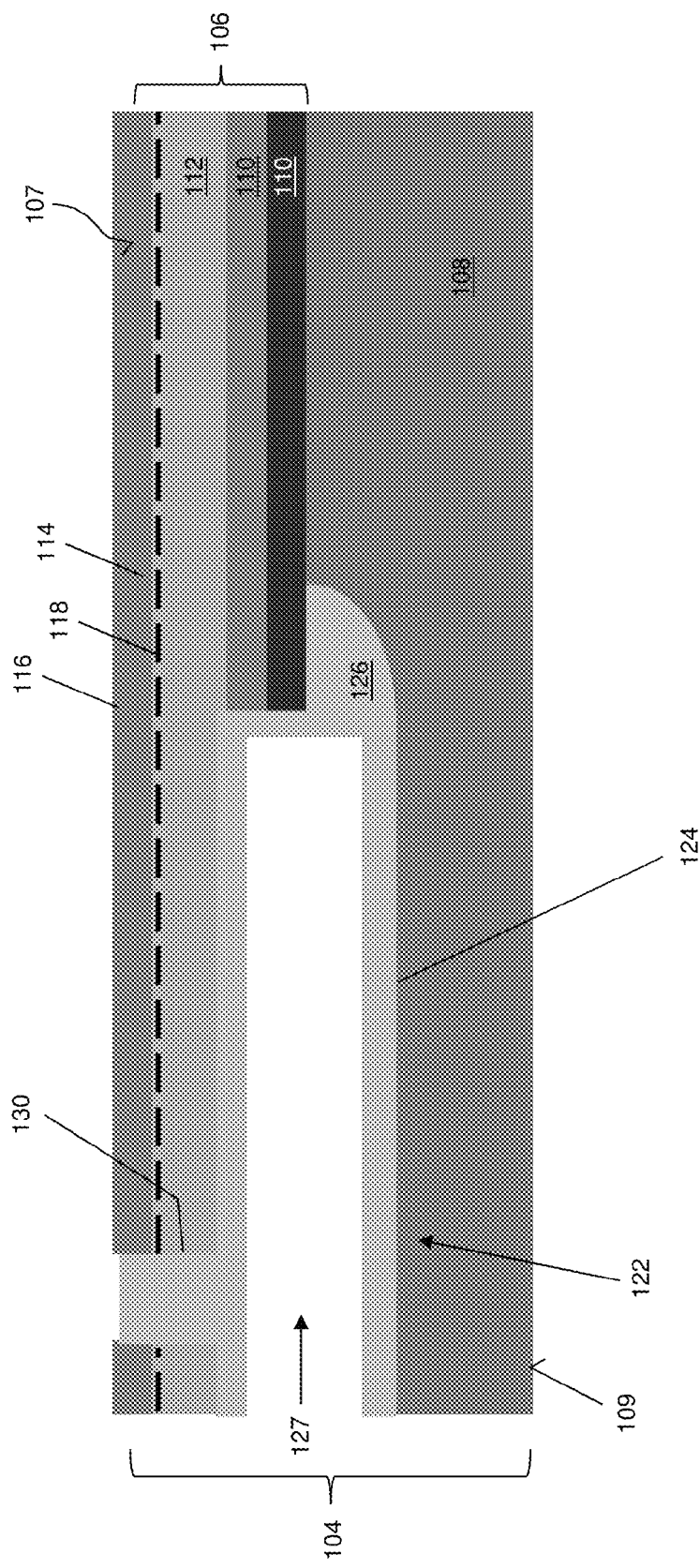
FIG. 7 illustrates a cross-sectional view of yet another embodiment of a high breakdown voltage compound semiconductor device.

FIG. 7 illustrates a cross-sectional view of another embodiment of the compound semiconductor device, where the cavity 124 is not completely filled with the insulating material 126. According to this embodiment, the trench 130 in the device active region 100 used to form the cavity 124 is not wide enough to ensure the cavity 124 is completely filled with the insulating material 126 e.g. during ALD or LPCVD. Instead, the cavity is lined with the insulating material 126 and the trench 130 above the cavity 124 fills with the insulating material 126 to close off the cavity 124. The remainder of the cavity 124 is hollow and filled with a gas such as SF6 to complete the insulating region 122. The insulating region 122 with the hollow region 127 has an even lower dielectric constant k according to this embodiment, further reducing the parasitic capacitance of the substrate contact. If arcing is not an issue, air can be used to fill the hollow region 127 instead of SF6. The cavity 124 with the hollow region 127 can be formed partly in the compound semiconductor material 106 and partly in the substrate 108 as shown in FIG. 7, or entirely in the substrate 108 below the compound semiconductor material 106.

For both completely and partly filled cavities 124, the implementation of the low-k buffer structure can use standard silicon technology processing and performed after any high temperature process such as implanted Si activation and gate oxide densification. Deposition of the insulating material 126 in the cavity 124 can be performed prior to any buffer isolation if implantation is used to lower the thermal budget after the damage implant.

Figure 8C:
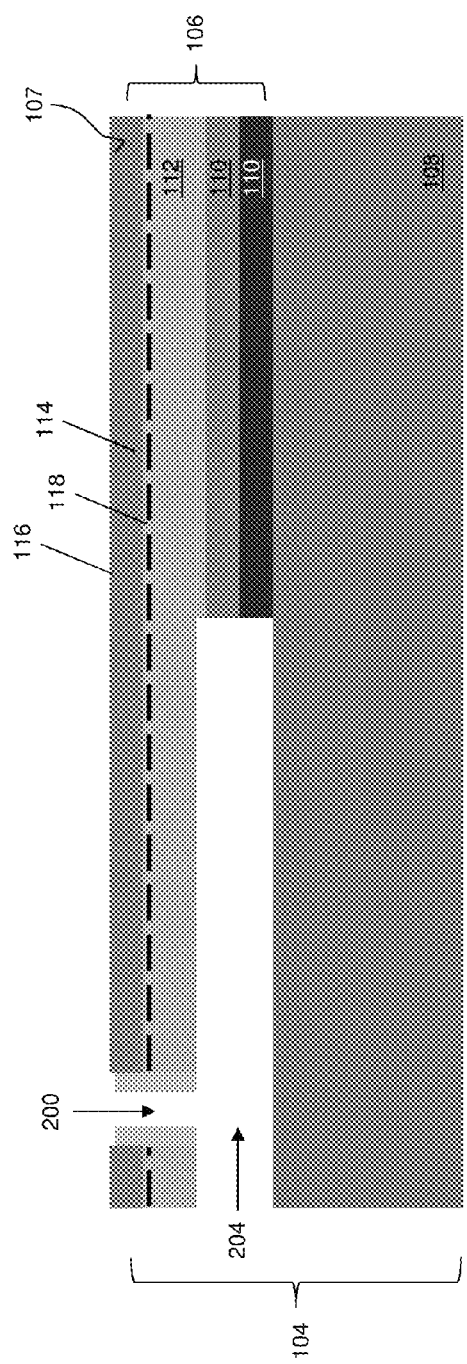

FIGS. 8A through 8E illustrate cross-sectional views of the semiconductor body 104 during different process steps according to an embodiment. FIG. 8A shows the semiconductor body 104 after a trench 200 is etched into the semiconductor body 104 in a vertical direction perpendicular to a first main surface 107 of the semiconductor body 104. The trench 200 extends through the compound semiconductor material 106 to the substrate 108 according to this embodiment.

FIG. 8B shows the semiconductor body 106 after an upper part of the trench sidewalls is protected, e.g. by a partial sidewall passivation 202. The partial sidewall passivation 202 protects the upper part of the GaN buffer 112 during subsequent etching. The partial sidewall passivation 202 can be formed by oxidizing a pre-deposited silicon layer. The lower part of the trench sidewalls can be prevented from oxidizing by filling the lower part of the trench 200 with SiN prior to the oxidation process, the SiN being removed after oxidization.

FIG. 8C shows the semiconductor body 104 after an etchant is disposed in the trench 200 to etch an upper part 204 of a cavity 124 into the semiconductor body 104 in a lateral direction parallel to the first main surface 107 of the semiconductor body 104. The upper passivated part of the trench sidewalls is protected from the etchant so that the upper part 204 of the cavity 124 is formed below the protected part of the trench sidewalls in the GaN buffer 112 and any transition layers 110 which may be present. In case of using hot phosphoric acid to etch III-nitride layers, the lateral etch rate is much faster than the vertical etch rate, which would attack layer 112. Hot phosphoric acid does not attack the (vertical) c-plane of the GaN buffer 112, allowing for precise control of III-nitride buffer etching.

Figure 8D:
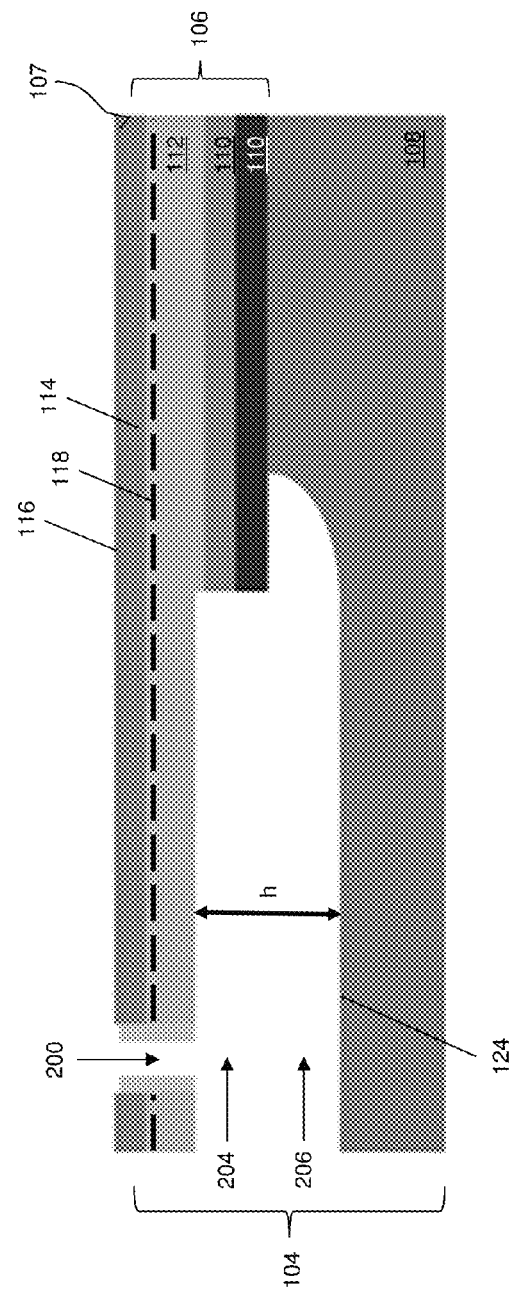

FIG. 8D shows the semiconductor body 104 after a lower part 206 of the cavity 124 is formed in the substrate 108. The lower part 206 of the cavity 124 can be formed by selectively etching the substrate 108. The compound semiconductor material 106 can be protected by a stable passivation layer such as silicon oxide or silicon nitride. Following this step, the substrate 108 can be wet chemically etched to achieve the final insulation region thickness or height (h). This step can also be achieved without a prior selective etch of the upper GaN stack 112. The cavity 124 is formed partly in the compound semiconductor material 106 and partly in the substrate 108 according to this embodiment.

Alternatively, the cavity 124 can be formed entirely in the substrate 108 as shown in FIG. 6. In one embodiment, the cavity 124 can be formed entirely in the substrate 108 by forming a trench 200 which extends through the compound semiconductor material 106 to the substrate 108. An etchant is then disposed in the trench 200, the etchant selected to attack only the substrate 108 so that the cavity 124 is formed entirely in the substrate 108. In this case, partial passivation of the trench sidewalls is not needed if the etching solution is selected to not attack the compound semiconductor material 106.

Figure 8E:
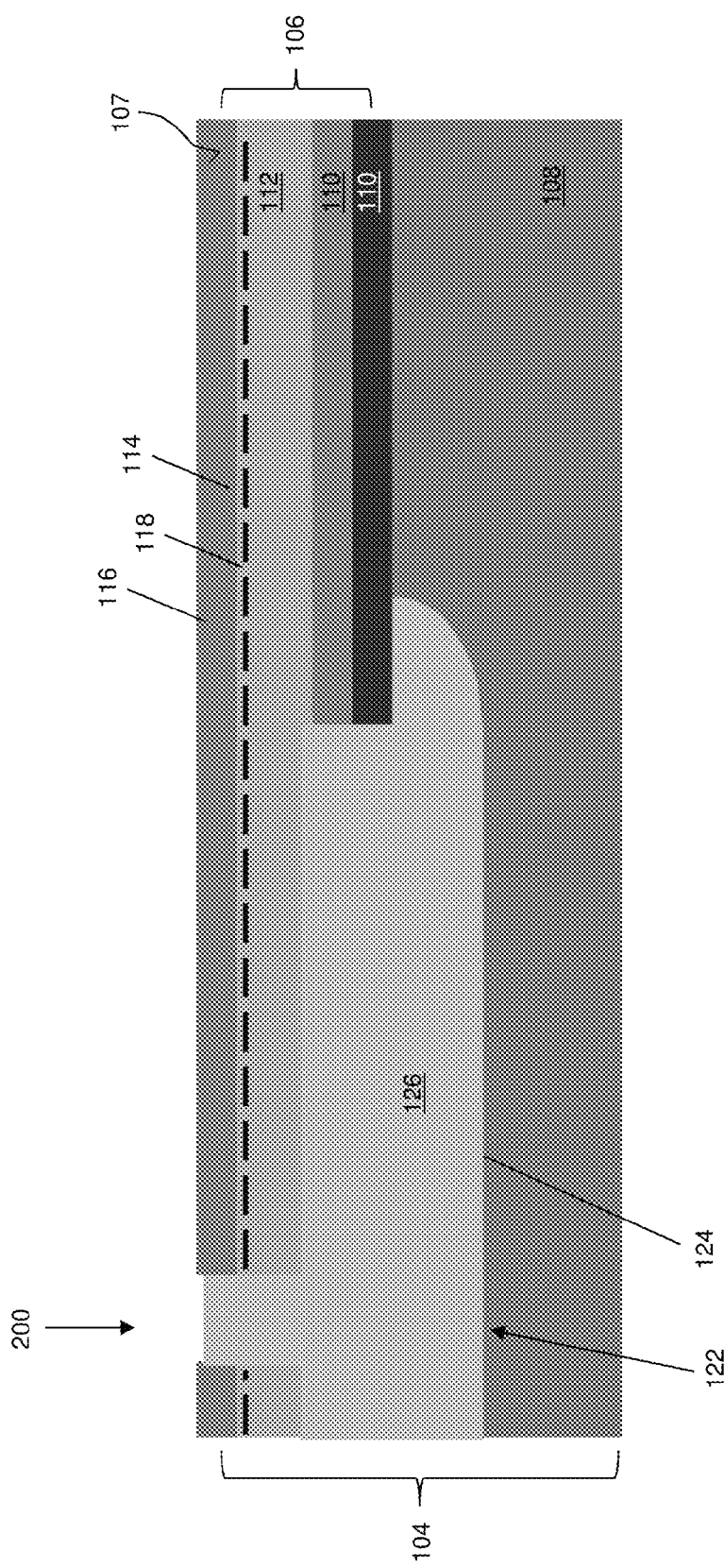

FIG. 8E shows the semiconductor body 104 after the cavity 124 is filled with an insulating material 126 such as silicon oxide, silicon nitride, diamond, etc. The insulating material 126 can be deposited by ALD or LPCVD. Alternatively, the cavity 124 can be filled by CVD-diamond processing which result in better thermal conduction and higher breakdown strength from the GaN buffer 112. In each case, to fill the cavity 124 with an insulating material 126 a trench 200 is formed in the inactive region 102 and/or in the active region 100 of the device as previously described herein. For example, the trench 200 extends perpendicular to the source and the drain over a length of the insulating region 122 which extends parallel to the source and the drain.

A smaller trench 200 instead can be used to form the cavity 124 as previously described herein, which closes off during deposition of the insulating material 126 before the entire cavity 124 is filled with the insulating material 126. According to this alternate embodiment, the cavity 124 is lined with the insulating material 126 and a hollow region 127 remains which is filled with a gas such as air or SF6 as previously described herein and shown in FIG. 7. In either case, the insulating material 126 is removed from the top side 107 of the semiconductor body 104 or passivation layer 116 if present by dry etching and/or CMP (chemical mechanical polishing).

Figure 9:
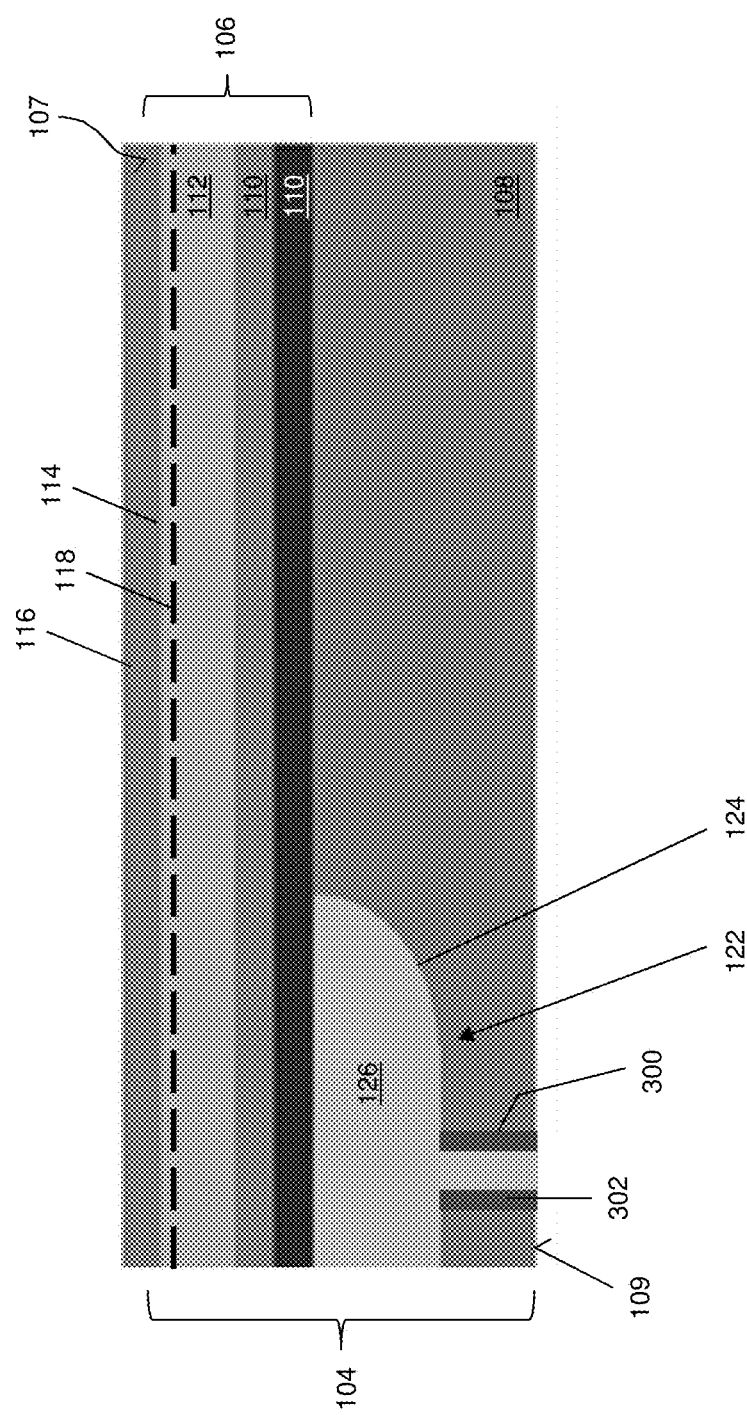
FIG. 9 illustrates a cross-sectional view of a semiconductor body during a different manufacturing process.

FIG. 9 illustrates a cross-sectional view of the semiconductor body 104 during a different process according to another embodiment. The trench(es) 300 used to form the cavity 124 in the semiconductor body 104 are etched into the substrate 108 from a side 109 of the substrate 108 facing away from the compound semiconductor material 106 according to this embodiment. The sidewalls of the trench 300 formed in the substrate 108 are passivated 302 for protection from an etchant which is disposed in the trench 300. The etchant removes part of the substrate 108 to form the cavity 124 entirely in the substrate 108. The cavity 124 is then partly or completely filled with an insulating material 126 as previously described herein to form the insulating region 122 between the compound semiconductor material 106 and the substrate 108 at the source or drain side of the device.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body including a compound semiconductor material on a substrate, the compound semiconductor material having a channel region;
   a source region extending to the compound semiconductor material;
   a drain region extending to the compound semiconductor material and spaced apart from the source region by the channel region; and
   an insulating region buried in the semiconductor body below the channel region between the compound semiconductor material and the substrate in an active region of the semiconductor device such that the channel region is uninterrupted by the insulating region, the active region including the source, the drain and the channel region, the insulating region being discontinuous over a length of the channel region between the source region and the drain region.

2. The semiconductor device of claim 1, wherein the insulating region comprises a hollow cavity lined with an insulating material.

3. The semiconductor device of claim 2, wherein the hollow cavity is formed partly in the compound semiconductor material and partly in the substrate.

4. The semiconductor device of claim 2, wherein the hollow cavity is formed entirely in the substrate below the compound semiconductor material.

5. The semiconductor device of claim 2, wherein the hollow cavity is filled with a gas.

6. The semiconductor device of claim 1, wherein the insulating region comprises a cavity filled with an insulating material.

7. The semiconductor device of claim 6, wherein the cavity is formed partly in the compound semiconductor material and partly in the substrate.

8. The semiconductor device of claim 6, wherein the cavity is formed entirely in the substrate below the compound semiconductor material.

9. The semiconductor device of claim 1, wherein the compound semiconductor material comprises a GaN alloy layer on a GaN layer, the channel region is a two-dimensional electron gas disposed in the GaN layer near an interface with the GaN alloy layer, and the insulating region is disposed below the GaN alloy layer and the two-dimensional electron gas.

10. The semiconductor device of claim 1, further comprising:
   a trench extending from a main surface of the compound semiconductor material to the insulating region in a region of the semiconductor body outside the active region; and
   an insulating material disposed in the trench.

11. The semiconductor device of claim 10, wherein the trench extends perpendicular to the source and the drain over a length of the insulating region.

12. The semiconductor device of claim 1, further comprising a conductive plug extending from the drain or source region, through the compound semiconductor material to a side of the substrate facing away from the compound semiconductor material.

13. A semiconductor device, comprising:
 a semiconductor substrate;
 a compound semiconductor epitaxial material grown on the semiconductor substrate, the compound semiconductor epitaxial material having a channel region and a higher energy band gap than the semiconductor substrate;
 a first doped region extending to the compound semiconductor epitaxial material;
 a second doped region extending to the compound semiconductor epitaxial material and spaced apart from the first doped region by the channel region; and
 an insulating region disposed below the channel region between the compound semiconductor epitaxial material and the substrate such that the channel region is uninterrupted by the insulating region, the insulating region extending laterally in a direction parallel to a main surface of the compound semiconductor epitaxial material, the insulating region being discontinuous over a length of the channel region between the first and second doped regions.

* * * * *